United States Patent
Atti et al.

(10) Patent No.: US 9,601,125 B2
(45) Date of Patent: Mar. 21, 2017

(54) SYSTEMS AND METHODS OF PERFORMING NOISE MODULATION AND GAIN ADJUSTMENT

(71) Applicant: QUALCOMM Incorporated, San Diego, CA (US)

(72) Inventors: Venkatraman Srinivasa Atti, San Diego, CA (US); Venkatesh Krishnan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 302 days.

(21) Appl. No.: 14/012,749

(22) Filed: Aug. 28, 2013

(65) Prior Publication Data
US 2014/0229172 A1  Aug. 14, 2014

Related U.S. Application Data

(60) Provisional application No. 61/762,810, filed on Feb. 8, 2013.

(51) Int. Cl.
*G10L 21/038* (2013.01)
*G10L 19/032* (2013.01)
*G10L 19/06* (2013.01)

(52) U.S. Cl.
CPC .......... *G10L 19/032* (2013.01); *G10L 21/038* (2013.01); *G10L 19/06* (2013.01)

(58) Field of Classification Search
CPC ...................................................... G10L 21/038

(Continued)

(56) References Cited

U.S. PATENT DOCUMENTS 8,126,708 B2 * 2/2012 Rajendran ............... G10L 21/00
  704/224
8,260,611 B2 * 9/2012 Vos ...................... G10L 19/0208
  704/219

(Continued)

FOREIGN PATENT DOCUMENTS

EP  1808684 A1  7/2007
WO  2006107840 A1  10/2006

OTHER PUBLICATIONS

Partial International Search Report of International Application No. PCT/US2013/057368, dated Dec. 12, 2013, 8 pages.

(Continued)

*Primary Examiner* — Susan McFadden
(74) *Attorney, Agent, or Firm* — Toler Law Group, PC

(57) ABSTRACT

A method includes receiving a first value of a mixing factor. The first value corresponds to a first portion of an audio signal received at an audio encoder. The method includes receiving a second value of the mixing factor. The second value corresponds to a second portion of the audio signal. The method also includes generating a third value of the mixing factor at least partially based on the first value and the second value and mixing an excitation signal with modulated noise based on the third value. Another method includes determining a first set of spectral frequency values corresponding to an audio signal and determining a second set of spectral frequency values that approximates the first set of spectral frequency values. A gain value corresponding to at least a portion of the audio signal is adjusted based on a difference between the first set and the second set.

49 Claims, 7 Drawing Sheets

(58) Field of Classification Search
USPC .......................................................... 704/225
See application file for complete search history.

(56) References Cited

U.S. PATENT DOCUMENTS

| | | | |
|---|---|---|---|
| 8,688,441 B2* | 4/2014 | Ramabadran | G10L 21/038 |
| | | | 704/200 |
| 9,129,600 B2* | 9/2015 | Gibbs | G10L 19/20 |
| 2003/0115042 A1 | 6/2003 | Chen et al. | |
| 2003/0128851 A1 | 7/2003 | Furuta | |
| 2006/0173691 A1 | 8/2006 | Mukaide | |
| 2007/0282599 A1 | 12/2007 | Choo et al. | |
| 2008/0027718 A1 | 1/2008 | Krishnan et al. | |
| 2008/0114605 A1 | 5/2008 | Wu et al. | |
| 2010/0198587 A1 | 8/2010 | Ramabadran et al. | |
| 2011/0295598 A1 | 12/2011 | Yang et al. | |
| 2012/0300946 A1 | 11/2012 | Ma | |

OTHER PUBLICATIONS

International Search Report and Written Opinion for International Application No. PCT/US2013/057368, mailed Feb. 24, 2014, 18 pages.

* cited by examiner

SYSTEMS AND METHODS OF PERFORMING NOISE MODULATION AND GAIN ADJUSTMENT

I. CROSS-REFERENCE TO RELATED APPLICATIONS

The present application claims priority from commonly owned U.S. Provisional Patent Application No. 61/762,810 filed on Feb. 8, 2013, the content of which is expressly incorporated herein by reference in its entirety.

II. FIELD

The present disclosure is generally related to signal processing.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player.

In traditional telephone systems (e.g., public switched telephone networks (PSTNs)), signal bandwidth is limited to the frequency range of 300 Hertz (Hz) to 3.4 kiloHertz (kHz). In wideband (WB) applications, such as cellular telephony and voice over internet protocol (VoIP), signal bandwidth may span the frequency range from 50 Hz to 7 kHz. Super wideband (SWB) coding techniques support bandwidth that extends up to around 16 kHz. Extending signal bandwidth from narrowband telephony at 3.4 kHz to SWB telephony of 16 kHz may improve the quality of signal reconstruction, intelligibility, and naturalness.

SWB coding techniques typically involve encoding and transmitting the lower frequency portion of the signal (e.g., 50 Hz to 7 kHz, also called the "low-band"). For example, the low-band may be represented using filter parameters and/or a low-band excitation signal. However, in order to improve coding efficiency, the higher frequency portion of the signal (e.g., 7 kHz to 16 kHz, also called the "high-band") may not be fully encoded and transmitted. Instead, a receiver may utilize signal modeling to predict the high-band. In some implementations, data associated with the high-band may be provided to the receiver to assist in the prediction. Such data may be referred to as "side information," and may include gain information, line spectral frequencies (LSFs, also referred to as line spectral pairs (LSPs)), etc. High-band prediction using a signal model may be acceptably accurate when the low-band signal is sufficiently correlated to the high-band signal. However, in the presence of noise, the correlation between the low-band and the high-band may be weak, and the signal model may no longer be able to accurately represent the high-band. This may result in artifacts (e.g., distorted speech) at the receiver.

IV. SUMMARY

Systems and methods of performing noise modulation and gain adjustment are disclosed. For example, high-band encoding may involve generating a high-band excitation signal based on a low-band excitation signal generated using low-band analysis (e.g., low-band linear prediction (LP) analysis). The high-band excitation signal may be generated by mixing a transformed low-band excitation signal with modulated noise (e.g., white noise). The ratio at which the transformed low-band excitation signal and the modulated noise are mixed may impact signal reconstruction quality. In the presence of noise that decreases correlation between the low-band and the high-band, the transformed low-band excitation signal may be inadequate for high-band synthesis. For example, the synthesized high-band excitation signal may introduce audible artifacts. In accordance with the described techniques, noise modulation and/or gain adjustment may be performed to decrease such artifacts. Performing noise modulation may include adaptively smoothing the ratio of low-band excitation to modulated noise used for high-band synthesis. Performing gain adjustment may include determining gain parameter(s) to include in high-band side information based on quantization distortion.

In a particular embodiment, a method includes receiving a first value of a mixing factor. The first value corresponds to a first portion of an audio signal received at an audio encoder. The method includes receiving a second value of the mixing factor. The second value corresponds to a second portion of the audio signal. The method includes generating a third value of the mixing factor at least partially based on the first value and the second value. The method also includes mixing an excitation signal with modulated noise based on the third value of the mixing factor.

In another particular embodiment, the method includes determining a first set of spectral frequency values corresponding to an audio signal and determining a second set of spectral frequency values that approximates the first set of spectral frequency values. The method also includes adjusting a gain value corresponding to at least a portion of the audio signal based on a difference between the first set and the second set.

In another particular embodiment, an apparatus includes a filter configured to generate a third value of a mixing factor at least partially based on a first value of the mixing factor and a second value of the mixing factor. The first value corresponds to a first portion of an audio signal and the second value corresponds to a second portion of the audio signal. The apparatus also includes a mixer configured to receive the third value and to generate a high-band excitation signal corresponding to a high-band portion of the audio signal by generating modulated noise and combining the modulated noise and a transformed version of a low-band excitation signal. The low-band excitation signal corresponds to a low-band portion of the audio signal. The mixer is configured to combine the modulated noise and the transformed version of the low-band excitation signal based on the third value.

In another particular embodiment, an apparatus includes an analysis filter configured to determine a first set of spectral frequency values corresponding to an audio signal. The apparatus includes a quantizer configured to generate a second set of spectral frequency values that approximates the first set of spectral frequency values. The apparatus also includes a gain circuit configured to adjust a gain value corresponding to at least a portion of the audio signal based on a difference between the first set and the second set.

In another particular embodiment, an apparatus includes means for generating a third value of a mixing factor at least partially based on a first value of the mixing factor and a second value of the mixing factor. The first value corresponds to a first portion of an audio signal received at an audio encoder and the second value corresponds to a second portion of the audio signal. The apparatus includes means for generating a high-band excitation signal corresponding to a high-band portion of the audio signal by combining modulated noise and a transformed version of a low-band excitation signal. The low-band excitation signal corresponds to a low-band portion of the audio signal. The means for generating is configured to combine the modulated noise and the transformed version of the low-band excitation signal based on the third value.

In another particular embodiment, an apparatus includes means for determining a first set of spectral frequency values corresponding to an audio signal. The apparatus also includes means for generating a second set of spectral frequency values that approximates the first set of spectral frequency values. The apparatus also includes means for adjusting a gain value corresponding to at least a portion of the audio signal based on a difference between the first set and the second set.

In another particular embodiment, a non-transitory computer-readable medium includes instructions that, when executed by a computer, cause the computer to receive a first value of a mixing factor. The first value corresponds to a first portion of an audio signal received at an audio encoder. The instructions are also executable to cause the computer to receive a second value of the mixing factor. The second value corresponds to a second portion of the audio signal. The instructions are also executable to cause the computer to generate a third value of the mixing factor at least partially based on the first value and the second value. The instructions are also executable to cause the computer to mix an excitation signal with modulated noise based on the third value of the mixing factor.

In another particular embodiment, a non-transitory computer-readable medium includes instructions that, when executed by a computer, cause the computer to determine a first set of spectral frequency values corresponding to an audio signal. The instructions are also executable to determine a second set of spectral frequency values that approximates the first set of spectral frequency values. The instructions are also executable to adjust a gain value corresponding to at least a portion of the audio signal based on a difference between the first set and the second set.

Particular advantages provided by at least one of the disclosed embodiments include an ability to perform noise modulation and/or gain adjustment to compensate for noisy conditions. For example, noise modulation may counteract large fluctuations in a mixing parameter used during high-band synthesis. As another example, gain adjustment may compensate for spectral distortion due to quantization error. Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
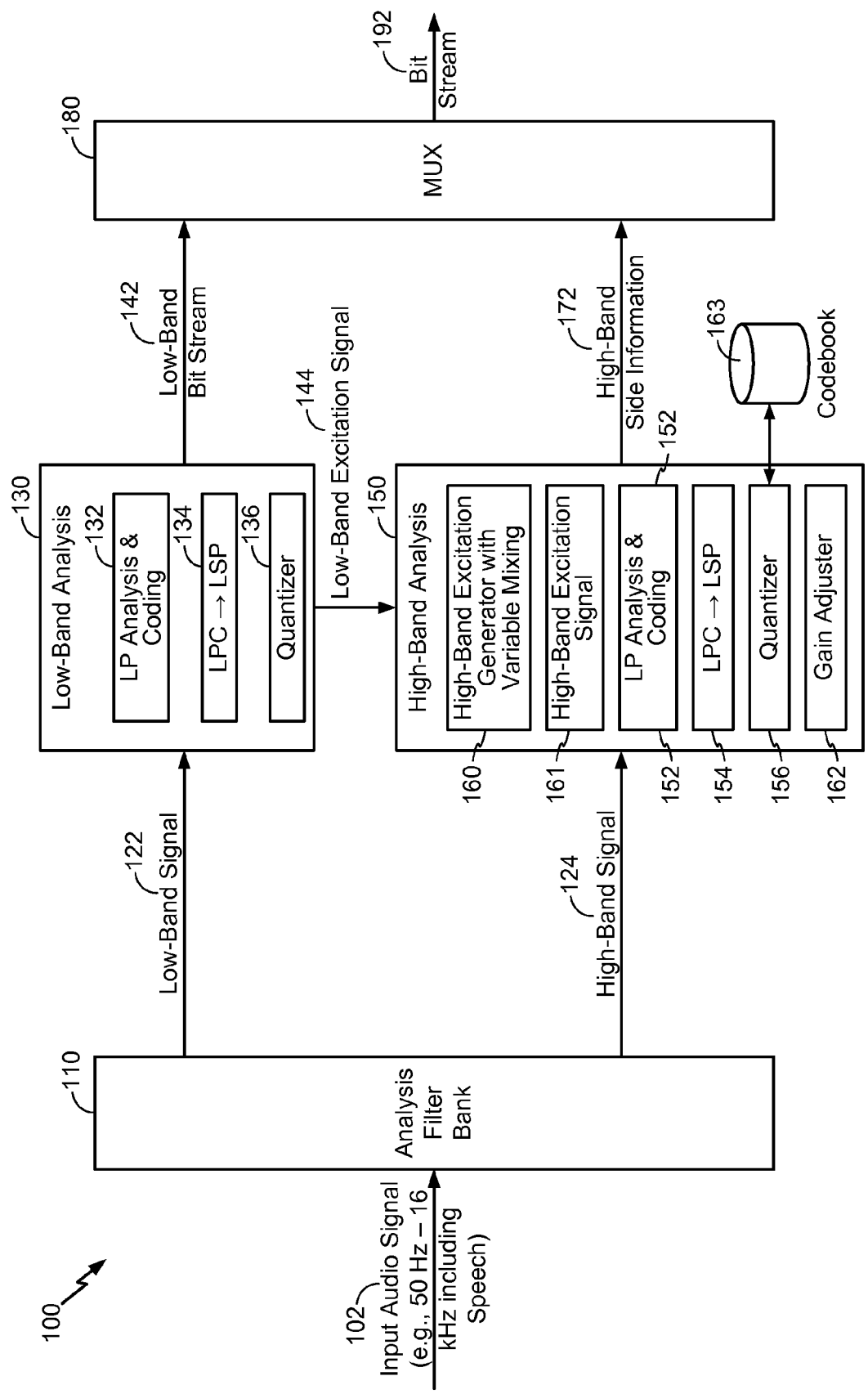
FIG. 1 is a diagram to illustrate a particular embodiment of a system that is operable to perform noise modulation and gain adjustment.

Referring to FIG. 1, a particular embodiment of a system that is operable to perform noise modulation and gain adjustment is shown and generally designated 100. In a particular embodiment, the system 100 may be integrated into an encoding system or apparatus (e.g., in a wireless telephone or coder/decoder (CODEC)).

It should be noted that in the following description, various functions performed by the system 100 of FIG. 1 are described as being performed by certain components or modules. However, this division of components and modules is for illustration only. In an alternate embodiment, a function performed by a particular component or module may instead be divided amongst multiple components or modules. Moreover, in an alternate embodiment, two or more components or modules of FIG. 1 may be integrated into a single component or module. Each component or module illustrated in FIG. 1 may be implemented using hardware (e.g., a field-programmable gate array (FPGA) device, an application-specific integrated circuit (ASIC), a digital signal processor (DSP), a controller, etc.), software (e.g., instructions executable by a processor), or any combination thereof.

The system 100 includes an analysis filter bank 110 that is configured to receive an input audio signal 102. For example, the input audio signal 102 may be provided by a microphone or other input device. In a particular embodiment, the input audio signal 102 may include speech. The input audio signal may be a super wideband (SWB) signal that includes data in the frequency range from approximately 50 hertz (Hz) to approximately 16 kilohertz (kHz). The analysis filter bank 110 may filter the input audio signal 102 into multiple portions based on frequency. For example, the analysis filter bank 110 may generate a low-band signal 122 and a high-band signal 124. The low-band signal 122 and the high-band signal 124 may have equal or unequal bandwidths, and may be overlapping or non-overlapping. In an alternate embodiment, the analysis filter bank 110 may generate more than two outputs.

In the example of FIG. 1, the low-band signal 122 and the high-band signal 124 occupy non-overlapping frequency bands. For example, the low-band signal 122 and the high-band signal 124 may occupy non-overlapping frequency bands of 50 Hz-7 kHz and 7 kHz-16 kHz. In an alternate embodiment, the low-band signal 122 and the high-band signal 124 may occupy non-overlapping frequency bands of 50 Hz-8 kHz and 8 kHz-16 kHz. In an another alternate embodiment, the low-band signal 122 and the high-band signal 124 overlap (e.g., 50 Hz-8 kHz and 7 kHz-16 kHz), which may enable a low-pass filter and a high-pass filter of the analysis filter bank 110 to have a smooth rolloff, which may simplify design and reduce cost of the low-pass filter and the high-pass filter. Overlapping the low-band signal 122 and the high-band signal 124 may also enable smooth blending of low-band and high-band signals at a receiver, which may result in fewer audible artifacts.

It should be noted that although the example of FIG. 1 illustrates processing of a SWB signal, this is for illustration only. In an alternate embodiment, the input audio signal 102 may be a wideband (WB) signal having a frequency range of approximately 50 Hz to approximately 8 kHz. In such an embodiment, the low-band signal 122 may correspond to a frequency range of approximately 50 Hz to approximately 6.4 kHz and the high-band signal 124 may correspond to a frequency range of approximately 6.4 kHz to approximately 8 kHz. It should also be noted that the various systems and methods herein are described as detecting high-band noise and performing various operations in response to high-band noise. However, this is for example only. The techniques illustrated with reference to FIGS. 1-7 may also be performed in the context of low-band noise.

The system 100 may include a low-band analysis module 130 configured to receive the low-band signal 122. In a particular embodiment, the low-band analysis module 130 may represent an embodiment of a code excited linear prediction (CELP) encoder. The low-band analysis module 130 may include a linear prediction (LP) analysis and coding module 132, a linear prediction coefficient (LPC) to line spectral pair (LSP) transform module 134, and a quantizer 136. LSPs may also be referred to as line spectral frequencies (LSFs), and the two terms may be used interchangeably herein. The LP analysis and coding module 132 may encode a spectral envelope of the low-band signal 122 as a set of LPCs. LPCs may be generated for each frame of audio (e.g., 20 milliseconds (ms) of audio, corresponding to 320 samples at a sampling rate of 16 kHz), each sub-frame of audio (e.g., 5 ms of audio), or any combination thereof. The number of LPCs generated for each frame or sub-frame may be determined by the "order" of the LP analysis performed. In a particular embodiment, the LP analysis and coding module 132 may generate a set of eleven LPCs corresponding to a tenth-order LP analysis.

The LPC to LSP transform module 134 may transform the set of LPCs generated by the LP analysis and coding module 132 into a corresponding set of LSPs (e.g., using a one-to-one transform). Alternately, the set of LPCs may be one-to-one transformed into a corresponding set of parcor coefficients, log-area-ratio values, immittance spectral pairs (ISPs), or immittance spectral frequencies (ISFs). The transform between the set of LPCs and the set of LSPs may be reversible without error.

The quantizer 136 may quantize the set of LSPs generated by the transform module 134. For example, the quantizer 136 may include or be coupled to multiple codebooks that include multiple entries (e.g., vectors). To quantize the set of LSPs, the quantizer 136 may identify entries of codebooks that are "closest to" (e.g., based on a distortion measure such as least squares or mean square error) the set of LSPs. The quantizer 136 may output an index value or series of index values corresponding to the location of the identified entries in the codebook. The output of the quantizer 136 may thus represent low-band filter parameters that are included in a low-band bit stream 142.

The low-band analysis module 130 may also generate a low-band excitation signal 144. For example, the low-band excitation signal 144 may be an encoded signal that is generated by quantizing a LP residual signal that is generated during the LP process performed by the low-band analysis module 130. The LP residual signal may represent prediction error.

The system 100 may further include a high-band analysis module 150 configured to receive the high-band signal 124 from the analysis filter bank 110 and the low-band excitation signal 144 from the low-band analysis module 130. The high-band analysis module 150 may generate high-band side information 172 based on the high-band signal 124 and the low-band excitation signal 144. For example, the high-band side information 172 may include high-band LSPs and/or gain information (e.g., based on at least a ratio of high-band energy to low-band energy), as further described herein.

The high-band analysis module 150 may include a high-band excitation generator 160. The high-band excitation generator 160 may generate a high-band excitation signal 161 by extending a spectrum of the low-band excitation signal 144 into the high-band frequency range (e.g., 7 kHz-16 kHz). To illustrate, the high-band excitation generator 160 may apply a transform to the low-band excitation signal (e.g., a non-linear transform such as an absolute-value or square operation) and may mix the transformed low-band excitation signal with a noise signal (e.g., white noise modulated according to an envelope corresponding to the low-band excitation signal 144 that mimics slow varying temporal characteristics of the low-band signal 122) to generate the high-band excitation signal 161. For example, the mixing may be performed according to the following equation:

High-band excitation=($\alpha$*transformed low-band excitation)+((1−$\alpha$)*modulated noise)

The ratio at which the transformed low-band excitation signal and the modulated noise are mixed may impact high-band reconstruction quality at a receiver. For voiced speech signals, the mixing may be biased towards the transformed low-band excitation (e.g., the mixing factor $\alpha$ may be in the range of 0.5 to 1.0). For unvoiced signals, the mixing may be biased towards the modulated noise (e.g., the mixing factor $\alpha$ may be in the range of 0.0 to 0.5). An illustrative embodiment of the high-band excitation generator 160 is described in further detail with respect to FIG. 4.

The high-band excitation signal 161 may be used to determine one or more high-band gain parameters that are included in the high-band side information 172. As illustrated, the high-band analysis module 150 may also include an LP analysis and coding module 152, a LPC to LSP transform module 154, and a quantizer 156. Each of the LP analysis and coding module 152, the transform module 154, and the quantizer 156 may function as described above with reference to corresponding components of the low-band analysis module 130, but at a comparatively reduced resolution (e.g., using fewer bits for each coefficient, LSP, etc.). The LP analysis and coding module 152 may generate a set of LPCs that are transformed to LSPs by the transform module 154 and quantized by the quantizer 156 based on a codebook 163. For example, the LP analysis and coding module 152, the transform module 154, and the quantizer 156 may use the high-band signal 124 to determine high-band filter information (e.g., high-band LSPs) that is included in the high-band side information 172. In a particular embodiment, the high-band side information 172 may include high-band LSPs as well as high-band gain parameters. In the presence of certain types of noise, the high-band gain parameters may be generated as a result of gain adjustment performed by a gain adjustment module 162, as further described herein.

The low-band bit stream 142 and the high-band side information 172 may be multiplexed by a multiplexer (MUX) 180 to generate an output bit stream 192. The output bit stream 192 may represent an encoded audio signal corresponding to the input audio signal 102. For example, the output bit stream 192 may be transmitted (e.g., over a wired, wireless, or optical channel) and/or stored. At a receiver, reverse operations may be performed by a demultiplexer (DEMUX), a low-band decoder, a high-band decoder, and a filter bank to generate an audio signal (e.g., a reconstructed version of the input audio signal 102 that is provided to a speaker or other output device). The number of bits used to represent the low-band bit stream 142 may be substantially larger than the number of bits used to represent the high-band side information 172. Thus, most of the bits in the output bit stream 192 may represent low-band data. The high-band side information 172 may be used at a receiver to regenerate the high-band excitation signal from the low-band data in accordance with a signal model. For example, the signal model may represent an expected set of relationships or correlations between low-band data (e.g., the low-band signal 122) and high-band data (e.g., the high-band signal 124). Thus, different signal models may be used for different kinds of audio data (e.g., speech, music, etc.), and the particular signal model that is in use may be negotiated by a transmitter and a receiver (or defined by an industry standard) prior to communication of encoded audio data. Using the signal model, the high-band analysis module 150 at a transmitter may be able to generate the high-band side information 172 such that a corresponding high-band analysis module at a receiver is able to use the signal model to reconstruct the high-band signal 124 from the output bit stream 192.

The transformed low-band excitation may be inadequate for use in high-band synthesis due to insufficient correlation between the noisy high-band signal 124 and the noisy low-band signal 122. For example, when the input audio signal 102 includes speech, the high-band signal 124 may be processed in 20 millisecond (ms) frames, and LSF and gain parameters may be estimated and quantized on a per-frame basis. Four temporal gain slope parameters may be estimated on a per-sub-frame basis (e.g., every 5 ms) and may be transmitted along with LSF and overall gain parameters. Thus, high-band excitation may be estimated (e.g., generated) for each sub-frame. Typically, the mixing parameter α may be determined based on low-band voicing parameters. However, in the presence of noise, determining the mixing parameter α in such fashion may result in wide fluctuations per sub-frame. For example, due to noise, the mixing parameter α for four consecutive sub-frames may be 0.9, 0.25, 0.8, and 0.15, resulting in buzzy or modulation artifacts. Moreover, a large amount of quantization distortion may be present.

The LP analysis and coding module 152 may generate a set of LPCs that are transformed to LSPs by the transform module 154 and quantized by the quantizer 156 based on the codebook 163. In the presence of noise, quantization distortion in the high-band LSPs may be large.

For example, the quantizer 156 may be configured to quantize a set of spectral frequency values, such as LSPs provided by the transformation module 154. In other embodiments, the quantizer 156 may receive and quantize sets of one or more other types of spectral frequency values in addition to, or instead of, LSFs or LSPs. For example, the quantizer 156 may receive and quantize a set of linear prediction coefficients (LPCs) generated by the LP analysis and coding module 152. Other examples include sets of parcor coefficients, log-area-ratio values, and immittance spectral frequencies (ISFs) that may be received and quantized at the quantizer 156. The quantizer 156 may include a vector quantizer that encodes an input vector (e.g., a set of spectral frequency values in a vector format) as an index to a corresponding entry in a table or codebook, such as the codebook 163. As another example, the quantizer 156 may be configured to determine one or more parameters from which the input vector may be generated dynamically at a decoder, such as in a sparse codebook embodiment, rather than retrieved from storage. To illustrate, sparse codebook examples may be applied in coding schemes such as CELP and codecs such as 3GPP2 (Third Generation Partnership 2) EVRC (Enhanced Variable Rate Codec). In another embodiment, the high-band analysis module 150 may include the quantizer 156 and may be configured to use a number of codebook vectors to generate synthesized signals (e.g., according to a set of filter parameters) and to select one of the codebook vectors associated with the synthesized signal that best matches the high-band signal 124, such as in a perceptually weighted domain.

High-band quantization outliers may adversely impact high-band synthesis and temporal gain estimation. For example, over-estimation of temporal and gain parameters may result in artifacts. To reduce such artifacts, the high-band analysis module 150 may include a gain adjuster 162.

Figure 3:
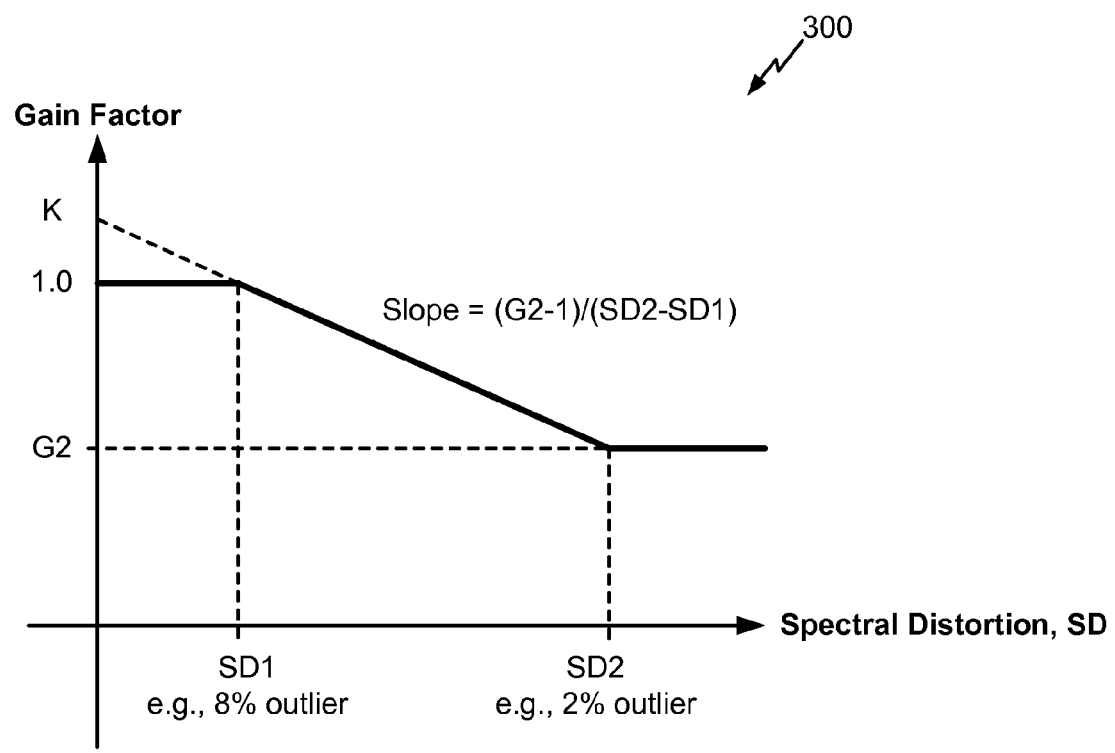
FIG. 3 is a graph to illustrate a particular embodiment of a mapping between gain factor and spectral distortion.

The gain adjuster 162 may estimate spectral distortion between a first set of spectral values (e.g., the unquantized LSFs produced by the transform module 154) and a second set of spectral values (e.g., the quantized LSFs produced by the quantizer 156). The gain adjuster 162 may estimate a gain factor based on a mapping of gain factor to spectral distortion. FIG. 3 illustrates an example of a graph 300 that maps gain factor to spectral distortion. In FIG. 3, "SD1" and "SD2" represent 8% and 2% outliers, respectively, that may be calculated from a probability distribution function. For example, during training of the codebook 163, a large amount of speech data (e.g., 10 hours of speech data) may be processed. During the processing, a probability distribution of spectral distortion may be generated, and SD1 and SD2 may be determined.

SD1 and SD2 may be used to determine values of the gain factor. In the example mapping 300 of FIG. 3, when spectral distortion is determined to be less than SD1 (e.g., less distortion than an 8% outlier), no gain adjustment is performed (e.g., the gain factor is set to 1). When spectral distortion is determined to be greater than SD2 (e.g., more distortion than a 2% outlier), attenuation may be performed by setting the gain factor to a value G2 that is less than 1, such as G2=0.5. When spectral distortion is in the range from SD1 to SD2, a linear relationship may be used to determine the gain factor. For example, a line having a slope of (G2−1)/(SD2−SD1) and an intercept of K may be used to map a spectral distortion value SD to a gain factor according to $$\text{GainFactor}=\text{slope}*SD+\text{intercept}=SD*(G2-1)/(SD2-SD1)+K.$$

In an exemplary embodiment, the gain adjuster 162 may determine a gain factor (e.g., to adjust a gain frame to be included in the high-band side information 172) in accordance with the following pseudocode.

```
/* Initialize the spectral distortion measure between the original
   unquantized LSF, i.e., lsp_shb_orig, and quantized LSFs, i.e., lsp_shb */
sd_uq_q = 0;
LPC_ORDER = 10; /* Initialize the LPC order */
for( i = 0; i < LPC_ORDER; i++ )
{
    /* Estimate the spectral distortion between the unquantized and
       quantized LSFs */
    sd_uq_q += (lsp_shb[i] − lsp_shb_orig[i]) * (lsp_shb[i] −
       lsp_shb_orig[i]);
}
/* Estimate the gain factor using the mapping of FIG. 3 */
GainFactor = sd_uq_q * (G2 − 1)/(SD2−SD1) + K;
```

-continued

```
/* Gain factor is limited between G2 and 1.0. */
GainFactor = min(max(GainFactor, G2), 1.0);
/* Frame gain adjustment */
GainFrame = GainFrame * GainFactor;
```

As illustrated in the above pseudocode, by using the mapping of FIG. 3, the gain adjuster 162 may limit artifacts due to spectral distortion (e.g., LSF outliers) when determining the gain factor.

In the above pseudocode, spectral distortion is determined as a sum of squares of errors due to quantization. Errors due to quantization are identified as a difference, for each spectral frequency value of a set of spectral frequency values, between a quantized version of the spectral frequency value and an un-quantized version of the spectral frequency value. Each error (e.g., each difference between quantized and un-quantized values) is squared, and spectral distortion is estimated as a sum of the squared errors. In other embodiments, spectral distortion estimates may be determined according to one or more other techniques. For example, spectral distortion may be determined according to a mean squared error (MSE) technique. As another example, spectral distortion may be determined using absolute values (e.g., magnitudes) of differences between values of a first set of un-quantized spectral frequency values and a second set of quantized spectral frequency values.

Although the above pseudocode and the mapping of FIG. 3 determine a value of a gain factor according to a piecewise linear mapping of spectral distortion estimates to gain factor values, in other embodiments other mappings may be used. For example, other mappings may map relatively lower spectral distortion estimates to larger gain factors (e.g., 1) for reduced attenuation and may map relatively higher spectral distortion estimates to smaller gain factors for increased attenuation according to the amount of quantization error. Although in some embodiments SD1 and SD2 may be determined in accordance with 8% and 2% outlier values, respectively, in other embodiments SD1 and/or SD2 may be determined based on one or more other outlier values or may be determined independently of outlier values.

Figure 2:
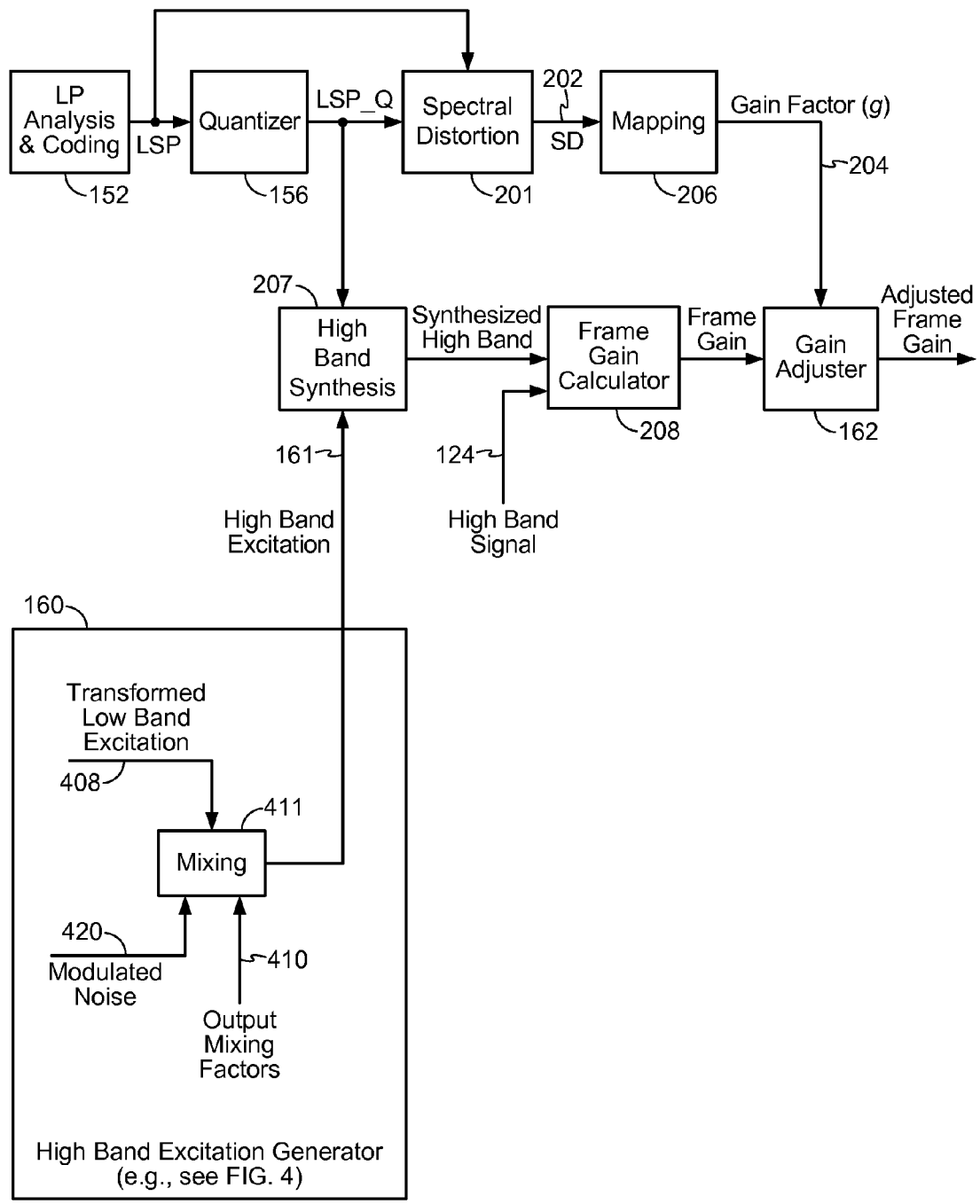
FIG. 2 is a diagram to illustrate a particular embodiment of components of the system of FIG. 1.

FIG. 2 illustrates a particular embodiment of components of the system 100 of FIG. 1 configured to adjust noise modulation and also to adjust frame gain based on spectral distortion. The LP analysis and coding module 152 is configured to receive the high-band signal 124 of FIG. 1 and to generate spectral frequency values, such as LSP information. The quantizer 156 is configured to receive the spectral frequency values and to generate quantized spectral frequency values, such as quantized LSP information (LSP_Q).

A spectral distortion calculator 201 is configured to receive a set of the spectral frequency values and a set of the quantized spectral frequency values and to determine a spectral distortion 202. For example, the spectral distortion calculator 201 may be configured to estimate the spectral distortion 202 in a similar manner as described with respect to the gain adjuster 162 of FIG. 1. The determined spectral distortion 202 may be provided to a mapping module 206.

The mapping module 206 may be configured to receive the spectral distortion 202 and to determine a gain factor (g) 204 based on a mapping of spectral distortion values to gain factor values. For example, the mapping module 206 may be configured to determine the gain factor 204 in a similar manner as described with respect to the gain adjuster 162 of FIG. 1. To illustrate, the mapping module 206 may apply the mapping 300 of FIG. 3 to determine a value of the gain factor 204 based on a received value of the spectral distortion 202. The gain factor 204 may be provided to the gain adjuster 162.

A high-band synthesis module 207 may be configured to receive the quantized spectral frequency values and to receive the high-band excitation signal 161 from the high band excitation generator 160 to generate a synthesized high band signal. For example, the high-band synthesis module 207 may be configured to apply a transformation of LSP values to LPC values and using the LPC values to configure the high band LP synthesis filter. The high-band synthesis module 207 may apply the high-band excitation signal 161 to the synthesis filter to generate the synthesized high band signal.

In a particular embodiment, the high-band excitation generator 160 includes a mixing module 411 that is configured to receive a transformed low band excitation 408, modulated noise 420, and output mixing factors 410, and to generate the high-band excitation signal 161 by applying the output mixing factors 410 to calculate a weighted sum of the transformed low band excitation 408 and the modulated noise 420. As described in further detail with respect to FIG. 4, the output mixing factors 410 may exhibit smoothing of the mixing factors between successive sub-frames of the audio signal 102 of FIG. 1 based on weighted sums of mixing factors that are computed for the sub-frames.

A frame gain calculator 208 may be configured to determine a frame gain based on the high band signal 124 of FIG. 1 and the synthesized high band signal that is generated by the synthesized high-band module 207. For example, the frame gain calculator 208 may determine a frame gain value for a particular frame of the audio signal based on a comparison of the high-band signal 124 to the synthesized high band signal. The frame gain value may be adjusted by the gain adjuster 162 based on the gain factor 204 to generate an adjusted frame gain.

An example of the high-band excitation generator 160 is further described with reference to FIG. 4. The high-band excitation generator 160 includes a combiner 406 having inputs coupled to an envelope calculator 402 and to a white noise generator 404. A mixing module 411 is coupled to an output of the combiner 406 and to an output of a non-linear transformation module 407. A mixing factor adjuster 409 is coupled to a mixing factor generator 412 and is also coupled to the mixing module 411. The mixing factor adjuster 409 is configured to generate output mixing factors 410 based on received mixing factors 413. The output mixing factors 410 are applied by the mixing module 411 to enable mixing smoothing.

The envelope calculator 402 may receive the low-band excitation signal 144 and may calculate a low-band time-domain envelope 403 corresponding to the low-band excitation signal 144. For example, the envelope calculator 402 may be configured to calculate the square of each sample of a frame of the low-band excitation signal 144 (or a filtered version of the low-band excitation signal 144) to produce a sequence of squared values. The envelope calculator 402 may be configured to perform a smoothing operation on the sequence of squared values, such as by applying a first-order IIR lowpass filter to the sequence of squared values. The envelope calculator 402 may be configured to apply a square root function to each sample of the smoothed sequence to produce the low-band time-domain envelope 403.

The combiner 406 may be configured to combine the low-band time-domain envelope 403 with white noise 405 generated by a white noise generator 404 to produce a modulated noise signal 420. For example, the combiner 406 may be configured to amplitude-modulate the white noise 405 according to the low-band time-domain envelope 403. For example, the combiner 406 may be implemented as a multiplier that is configured to scale the output of noise generator 404 according to the time domain envelope calculated by the envelope calculator 402 to produce the modulated noise signal 420 that is provided to the mixing module 411.

The mixing module 411 may be configured to mix the modulated noise signal 420 from the combiner 406 with a transformed low-band excitation signal 408. For example, the transformed low-band excitation signal 408 may be generated by the non-linear transformation module 407 based on the low-band excitation signal 144. In a particular embodiment, the non-linear transformation may be an absolute value ("|x|") transformation or an x-squared ("$x^2$") transformation.

The mixing module 411 may be configured to generate the high-band excitation signal 161 by mixing the modulated noise signal 420 from the combiner 406 and the transformed low-band excitation signal 408 based on a value of a mixing factor α 410 received from the mixing factor adjuster 409. For example, the mixing module 411 may be configured to calculate the high-band excitation signal 161 as a weighted sum by applying a mixing factor α 410 to the transformed low-band excitation signal 408 and by applying a factor of (1−α) to the modulated noise 420 received from the combiner 406 prior to summing the weighted transformed low-band excitation signal 408 and the weighted modulated noise.

The mixing factor generator 412 may be configured to generate the mixing factors 413 as multiple mixing factors for each frame of the audio signal. For example, four mixing factors $\alpha_1$, $\alpha_2$, $\alpha_3$, $\alpha_4$ may be generated for a frame of an audio signal, and each mixing factor may correspond to a respective sub-frame of the frame. For example, the mixing factor generator 412 may be configured to calculate mixing factors according to one or more parameters relating to a periodicity of the low-band signal 122 of FIG. 1 or of the low-band excitation signal 144, such as a pitch gain and/or a speech mode (e.g., voiced or unvoiced). As another example, the mixing factor generator 412 may be configured to calculate mixing factors according to a measure of periodicity of the high-band signal 124 of FIG. 1, such as a largest determined value of an autocorrelation coefficient of the high-band signal 124 for a frame or sub-frame of the audio signal.

The mixing factor adjuster 409 may generate the output mixing factors 410, such as four output mixing factors $\alpha_{1s}$, $\alpha_{2s}$, $\alpha_{3s}$, $\alpha_{4s}$. Each mixing factor may correspond to a respective sub-frame of a frame of an audio signal. The mixing factor adjuster 409 may generate the output mixing factors 410 in various ways to adaptively smooth the mixing factors within a single frame or across multiple frames to reduce an occurrence and/or extent of fluctuations of the output mixing factors 410. To illustrate, the mixing factor adjuster 409 may include a filter configured to receive a first value of the mixing factor α (e.g., $\alpha_1$) that corresponds to a first sub-frame of a particular frame and to receive a second value of the mixing factor α (e.g., $\alpha_2$) that corresponds to a second sub-frame of the particular frame. The mixing factor adjuster 409 may be configured to generate a third value of a mixing factor (e.g., $\alpha_{2s}$) at least partially based on the first value of the mixing factor α (e.g., $\alpha_1$) and the second value of the mixing factor (e.g., $\alpha_{2s}$).

For example, a first approach may include generating a value of the mixing factor α based on mixing factor values corresponding to portions (e.g., sub-frames) of a single frame. The following pseudocode corresponds to the first approach.

```
/* Approach 1: Mixing factor based on values within a frame */
mix_factor_new[0] = mix_factor[0]; /* Initialize the first sub-frame mix factor */
NB_SUBFR = 4; /* four sub-frames per frame */
K1 = 0.8;
for (i = 1; i < NB_SUBFR; i++)
{
    mix_factor_new[i] = K1 * mix_factor[i] + (1−K1) *
    mix_factor[i−1];
}
```

In the above pseudocode for the first approach, mix_factor[i] corresponds to an i-th mixing factor 413 generated by the mixing factor generator 412 for a particular frame (e.g., mix_factor[0] may correspond to $\alpha_1$) and mix_factor_new[i] corresponds to an i-th output mixing factor 410 (e.g., mix_factor_new[0] may correspond to $\alpha_{1s}$). K1 determines an amount of smoothing between sub-frames and is illustrated as having a value of 0.8. However, in other embodiments, K1 may be set to other values according to an amount of smoothing to be applied. For example, no smoothing is applied when K1=1, and smoothing increases with decreasing value of K1.

Other factors, such as coding type (e.g., whether or not a frame corresponds to a voiced frame or an unvoiced frame) may also be used to determine whether to generate smoothed values of mixing factors. For example, the mixing factor adjuster 409 may be responsive to an indication of a coding type (coder_type) 422 to generate the mixing factors. To illustrate, mixing factor smoothing may be enabled when the indication of the coding type corresponds to a voiced frame and may be disabled when the indication of the coding type corresponds to an unvoiced frame. As another example, the mixing factor adjuster 409 may be responsive to the spectral distortion information (SD) 202 of FIG. 2 to vary the mixing factors. As an example, when spectral distortion is relatively high (e.g., greater than a threshold amount, such as in accordance with an 8% outlier or 2% outlier as described with respect to spectral distortion of FIG. 3), a value of the mixing factor α may be constrained to a range of 0 to 0.5 with more bias towards the modulated noise. On the other hand, when the spectral distortion 202 is relatively low (e.g., less than a threshold amount corresponding to the 8% outlier as described with respect to SD1 of FIG. 3), the mixing may be biased towards the transformed low band excitation.

A second approach may include generating a value of the mixing factor α based on mixing factor values corresponding to portions (e.g., sub-frames) of different frames. The following pseudocode corresponds to the second approach.

```
/* Approach 2: Mixing factor based on values across frames */
NB_SUBFR = 4;
K1 = 0.8;
mix_factor_new[0] = K1 * mix_factor[0] + (1−K1) * mix_factor_old;
//first sub-frame
for (i = 1; i < NB_SUBFR; i++)
{
    mix_factor_new[i] = K1 * mix_factor[i] + (1−K1) *
    mix_factor[i−1];
}
mix_factor_old = mix_factor_new[i];
```

In the above pseudocode for the second approach, mix_factor[i] corresponds to an i-th mixing factor 413 generated by the mixing factor generator 412 for a particular frame (e.g., mix_factor[0] may correspond to $\alpha_1$) and mix_factor_new[i] corresponds to an i-th output mixing factor 410 for the particular frame (e.g., mix_factor_new[0] may correspond to $\alpha_{1s}$). Smoothing is performed across frames via mix_factor_old, which enables smoothing for a first sub-frame of a current frame based on a mixing factor determined for a last sub-frame of a previous frame.

A third approach may include generating the mixing factor α using an adaptive value. The following pseudocode corresponds to the third approach.

```
/* Approach 3: Mixing factor generation using adaptive K1 */
NB_SUBFR = 4;
/* Estimate current high-band energy; if fast varying use a slower
smoothing factor */
if ( hb_energy_prev > 2 * hb_energy_curr || hb_energy_curr > 2 *
hb_energy_prev)
    K1 = 0.8;
else
    K1 = 0.3;
mix_factor_new[0] = K1 * mix_factor[0] + (1−K1) * mix_factor_old;
//first sub-frame
for (i = 1; i < NB_SUBFR; i++)
{
    mix_factor_new[i] = K1 * mix_factor[i] + (1−K1) *
    mix_factor[i−1];
}
mix_factor_old = mix_factor_new[i];
```

In the above pseudocode for the third approach, smoothing is enabled across frames in a manner similar to the second approach. In addition, a value of K1 is determined based on high-band energy fluctuation of the audio signal. For example, a first weight (e.g., K1) applied to the first value and a second weight (e.g., 1−K1) applied to the second value are determined based on energy fluctuation of the high-band signal 124 of FIG. 1. A first high-band energy value hb_energy_prev corresponds to an energy of the high-band signal during a first portion of the audio signal (e.g., a previous frame), and a second high-band energy value hb_energy_curr corresponds to an energy of the high-band signal during a second portion of the audio signal (e.g., a current frame).

When a fluctuation in the high-band energy between frames is determined to be relatively large, the first weight (e.g., K1) and the second weight (e.g., 1−K1) are determined to have values that allow a greater rate of change and less smoothing between mixing factors of successive sub-frames. For example, in the pseudocode for the third approach, the first weight (e.g., K1=0.8) is selected to be greater than the second weight (e.g., (1−K1)=0.2) in response to the first high-band energy value exceeding a first threshold (e.g., when hb_energy_prev is greater than 2*hb_energy_curr) or in response to the second high-band energy value exceeding a second threshold (e.g., when hb_energy_curr is greater than 2*hb_energy_prev). The first threshold corresponds to the second high-band energy value (hb_energy_curr) scaled by a scaling factor (e.g., 2 in the above pseudocode). The second threshold corresponds to the first high-band energy value (hb_energy_prev) scaled by the scaling factor.

When a fluctuation in the high-band energy between frames is determined to be relatively small, the first weight (e.g., K1) and the second weight (e.g., 1−K1) are determined to have values that allow a lesser rate of change and greater smoothing between mixing factors of successive sub-frames. For example, in the pseudocode for the third approach, the first weight (e.g., K1=0.3) is selected to be less than the second weight (e.g., (1−K1)=0.7) in response to the first high-band energy value not exceeding the first threshold (e.g., when hb_energy_prev is less than or equal to 2*hb_energy_curr) and the second high-band energy value not exceeding the second threshold (e.g., when hb_energy_curr is less than or equal to 2*hb_energy_prev).

Although the pseudocode for the third approach provides an illustrative example of determining the first and second weights based on high-band energy fluctuation, in other embodiments alternate and/or additional comparisons of high-band energy values among multiple frames may be made to determine values of the first and second weights and to control smoothing of the mixing factor.

Figure 4:
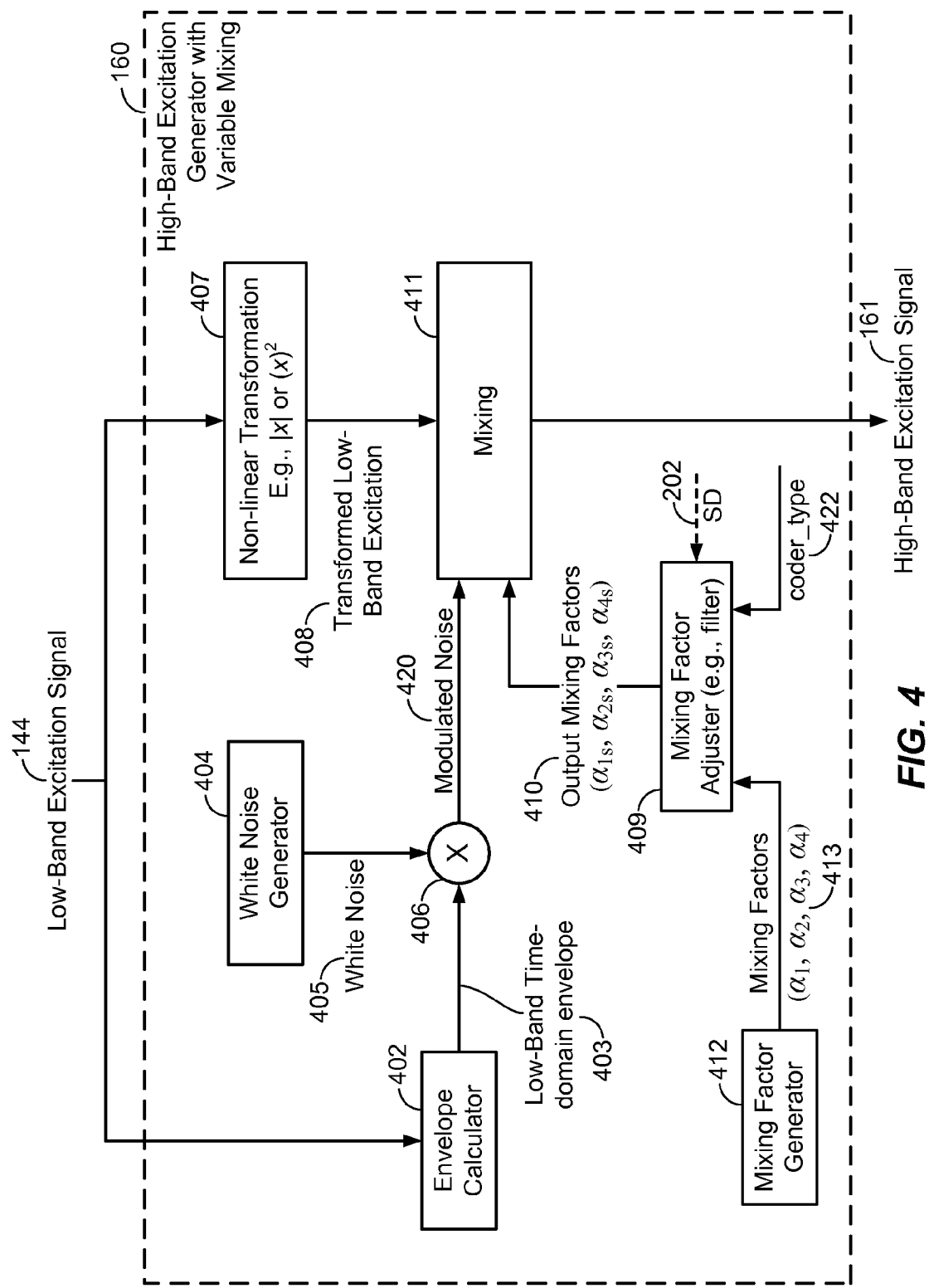
FIG. 4 is a diagram to illustrate a particular embodiment of the high-band excitation generator of FIG. 1.

Thus, as shown in FIG. 4, the high-band excitation generator 160 may generate smoothed mixing factors 410 and may adaptively determine one or more smoothing parameters (e.g., K1) based on an amount of high-band energy fluctuation from frame to frame.

Figure 5:
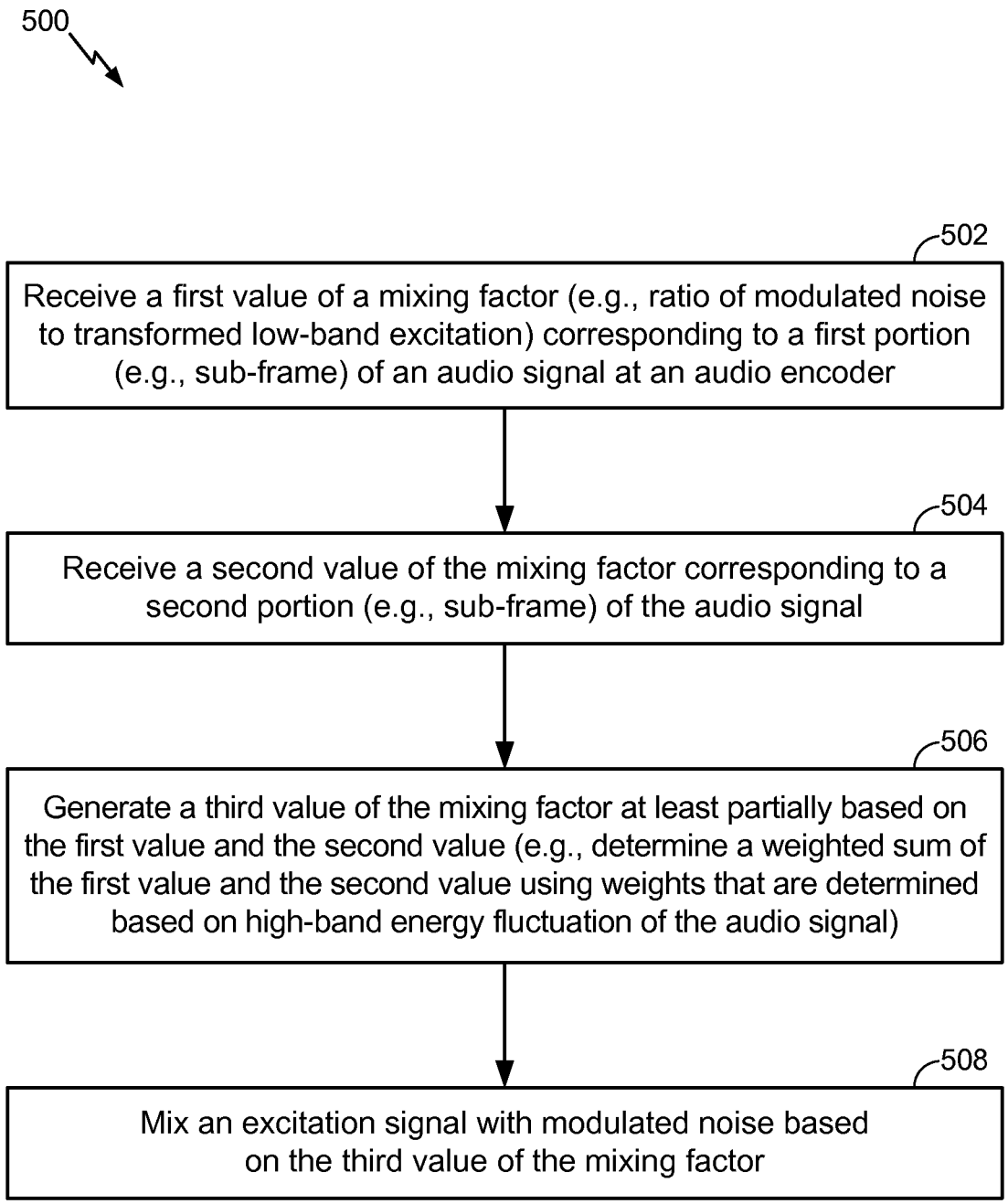
FIG. 5 is a flowchart to illustrate a particular embodiment of a method of performing noise modulation.

Referring to FIG. 5, a flowchart of a particular embodiment of a method of performing gain control is shown and generally designated 500. In an illustrative embodiment, the method 500 may be performed by the system 100 of FIG. 1, such as by the high-band excitation generator 160.

A first value of a mixing factor is received, at 502. The first value corresponds to a first portion of an audio signal received at an audio encoder. A second value of the mixing factor is received, at 504. The second value corresponds to a second portion of the audio signal. The first value may be generated based on a low-band portion of a first sub-frame of the audio signal and the second value may be generated based on a low-band portion of a second sub-frame of the audio signal. For example, the mixing factor adjuster 409 of FIG. 4 receives values of the mixing factors 413 from the mixing factor generator 412. To illustrate, the first value may correspond to one of $\alpha_1$, $\alpha_2$, $\alpha_3$, or $\alpha_4$, and the second value may correspond to another of $\alpha_1$, $\alpha_2$, $\alpha_3$, or $\alpha_4$.

A third value of the mixing factor is generated at least partially based on the first value and the second value, at 506. For example, the mixing factor adjuster 409 generates values of the output mixing factors 410 based on weighted sums of multiple received values of the mixing factors 413.

Generating the third value may include determining a weighted sum of the first value and the second value. For example, in the third approach described with respect to the mixing factor adjuster 409 of FIG. 4, a first weight applied to the first value (e.g., K1) and a second weight applied to the second value (e.g., 1−K1) may be determined based on high-band energy fluctuation of the audio signal. The first weight and the second weight may be determined based on a first high-band energy value corresponding to the first portion and further based on a second high-band energy value corresponding to the second portion (e.g., as described in the pseudocode corresponding to the third approach as hb_energy_prev and hb_energy_curr, respectively). The first weight may be selected to be greater than the second weight in response to the first high-band energy value exceeding a first threshold (e.g., hb_energy_prev>first threshold) or in response to the second high-band energy value exceeding a second threshold (e.g., hb_energy_curr>second threshold). The first threshold may correspond to the second high-band energy value scaled by a scaling factor (e.g., first threshold=2*hb_energy_curr), and the second threshold may correspond to the first high-band energy value scaled by the scaling factor (e.g., second threshold=2*hb_energy_prev).

The first portion may include a first sub-frame of the audio signal, and the second portion may include a second sub-frame of the audio signal. For example, the first sub-frame and the second sub-frame may be in a single frame of the audio signal. To illustrate, each of the first approach, the second approach, and the third approach described with respect to the mixing factor adjuster 409 of FIG. 4 may generate a third value of the mixing factor based on a first value of the mixing factor corresponding to one sub-frame of a particular frame and a second value of the mixing factor corresponding to another sub-frame of the particular frame.

As another example, the first sub-frame and the second sub-frames may be in different frames of the audio signal. For example, the second approach and the third approach described with respect to the mixing factor adjuster 409 of FIG. 4 may generate a third value of the mixing factor (e.g., for a first sub-frame of a particular frame) based on a first value of the mixing factor corresponding to a last sub-frame of a previous frame and based on a second value of the mixing factor corresponding to the first sub-frame of the particular frame.

An excitation signal is mixed with modulated noise based on the third value of the mixing factor, at 508. For example, a high-band excitation signal corresponding to a high-band portion of the audio signal may be generated. The high-band excitation signal may be generated based on combining the modulated noise and the excitation signal, where the excitation signal corresponds to a transformed version of a low-band excitation signal. For example, the mixing module 411 of FIG. 4 may generate the high-band excitation signal 161 based on combining the modulated 420 noise from the combiner 406 and the transformed version of the low-band excitation signal 144 (corresponding to a low-band portion of the audio signal 102 of FIG. 1). The mixing factor may indicate a ratio of the modulated noise to the transformed version of the low-band excitation signal. For example, the high-band excitation signal may be generated as a weighted sum of the modulated noise and the transformed version of the low-band excitation signal.

In particular embodiments, the method 500 of FIG. 5 may be implemented via hardware (e.g., a field-programmable gate array (FPGA) device, an application-specific integrated circuit (ASIC), etc.) of a processing unit such as a central processing unit (CPU), a digital signal processor (DSP), or a controller, via a firmware device, or any combination thereof. As an example, the method 500 of FIG. 5 can be performed by a processor that executes instructions, such as described with respect to FIG. 7.

Figure 6:
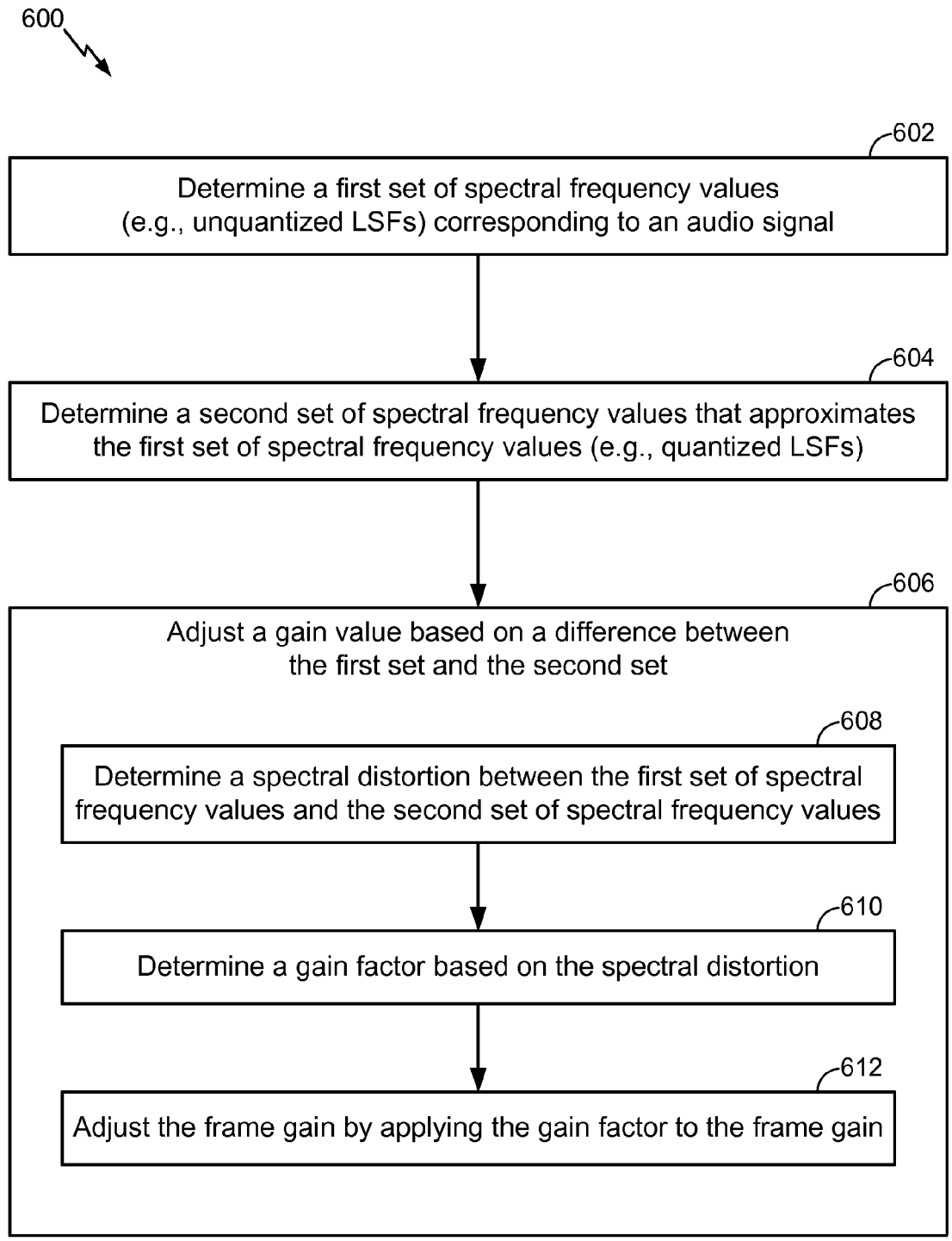
FIG. 6 is a flowchart to illustrate a particular embodiment of a method of performing gain adjustment.

Referring to FIG. 6, a flowchart of a particular embodiment of a method of performing gain control is shown and generally designated 600. In an illustrative embodiment, the method 600 may be performed by the system 100 of FIG. 1, such as by the high-band analysis module 160.

A first set of spectral frequency values corresponding to an audio signal is determined, at 602. For example, the first set of spectral frequency values may be generated by the LP analysis and coding module 152 of FIG. 1. To illustrate, the first set of spectral frequency values may be determined by performing LPC analysis to produce a set of LP filter coefficients for each frame of a high-band portion of an audio signal and may include a transformation of the LP filter coefficients.

A second set of spectral frequency values that approximates the first set of spectral frequency values is determined, at 604. For example, the second set of spectral values may be generated by the quantizer 156 of FIG. 1. The second set of spectral frequency values may be determined by searching a codebook, such as the codebook 163 of FIG. 1, based on the first set of spectral frequency values. In a particular embodiment, the first set of spectral frequency values includes line spectral frequency (LSF) values and the second set of spectral frequency values includes quantized LSF values. In other embodiments, the first set of spectral frequency values may be values other than LSF values. For example, the first set of spectral frequency values may include linear prediction coefficient (LPC) values, and the second set of spectral frequency values may include quantized LPC values.

A gain value corresponding to at least a portion of the audio signal is adjusted based on a difference between the first set and the second set, at 606. The gain value may correspond to a frame gain of a frame of the audio signal. For example, the frame gain value may be generated based on the high-band portion of the audio signal 102 of FIG. 1 and a synthesized high-band signal generated by applying the high-band excitation signal 161 to a synthesis filter, such as the synthesis filter 207 of FIG. 2. In a particular embodiment, the synthesis filter may be configured according to the first set of spectral frequency values or according to the second set of spectral frequency values (after transforming the second set to generate un-quantized values).

Adjusting the gain value may include determining a spectral distortion between the first set of spectral frequency values and the second set of spectral frequency values, at 608. For example, the spectral distortion may be the SD 202 generated by the spectral distortion module 201 of FIG. 2. A spectral distortion corresponding to the difference between the first set and the second set may be estimated according to various techniques. For example, the spectral distortion may be determined according to a mean square error of values in the second set of spectral frequency values as compared to values in the first set of spectral frequency values. As another example, the spectral distortion may be determined according to an absolute difference between values in the second set of spectral frequency values as compared to values in the first set of spectral frequency values.

Adjusting the gain value may also include determining a gain factor based on the spectral distortion, at 610. The gain factor may be determined according to a mapping of spectral distortion values to gain factor values, such as described with respect to the gain factor 204 generated by the mapping module 206 of FIG. 2 according to the mapping 300 of FIG. 3. To illustrate, a portion of the mapping may define that an increase in spectral distortion corresponds to a decrease in gain factor value, such as illustrated by the sloped portion of the mapping 300 between SD1 and SD2. The mapping may be at least partially based on spectral distortion values corresponding to outliers of a probability distribution function, such as described with respect to SD1 and SD2 of FIG. 3.

Adjusting the gain value may also include adjusting the frame gain by applying the gain factor to the frame gain, at 612. To illustrate, the gain value may be multiplied by the gain factor to attenuate portions of the high-band signal based on an amount of quantization error. Although the method 600 is described with respect to high-band components of FIGS. 1 and 4, the method 600 may be applied with respect to the low-band signal 122 of FIG. 1 or to any other portion of an audio signal 102 received at an encoder.

In particular embodiments, the method 600 of FIG. 6 may be implemented via hardware (e.g., a field-programmable gate array (FPGA) device, an application-specific integrated circuit (ASIC), etc.) of a processing unit, such as a central processing unit (CPU), a digital signal processor (DSP), or a controller, via a firmware device, or any combination thereof. As an example, the method 600 of FIG. 6 can be performed by a processor that executes instructions, as described with respect to FIG. 7.

FIGS. 1-6 thus illustrate examples including systems and methods that perform gain adjustment based on estimated spectral distortion and/or perform mixing factor smoothing to reduce artifacts due to noise.

Figure 7:
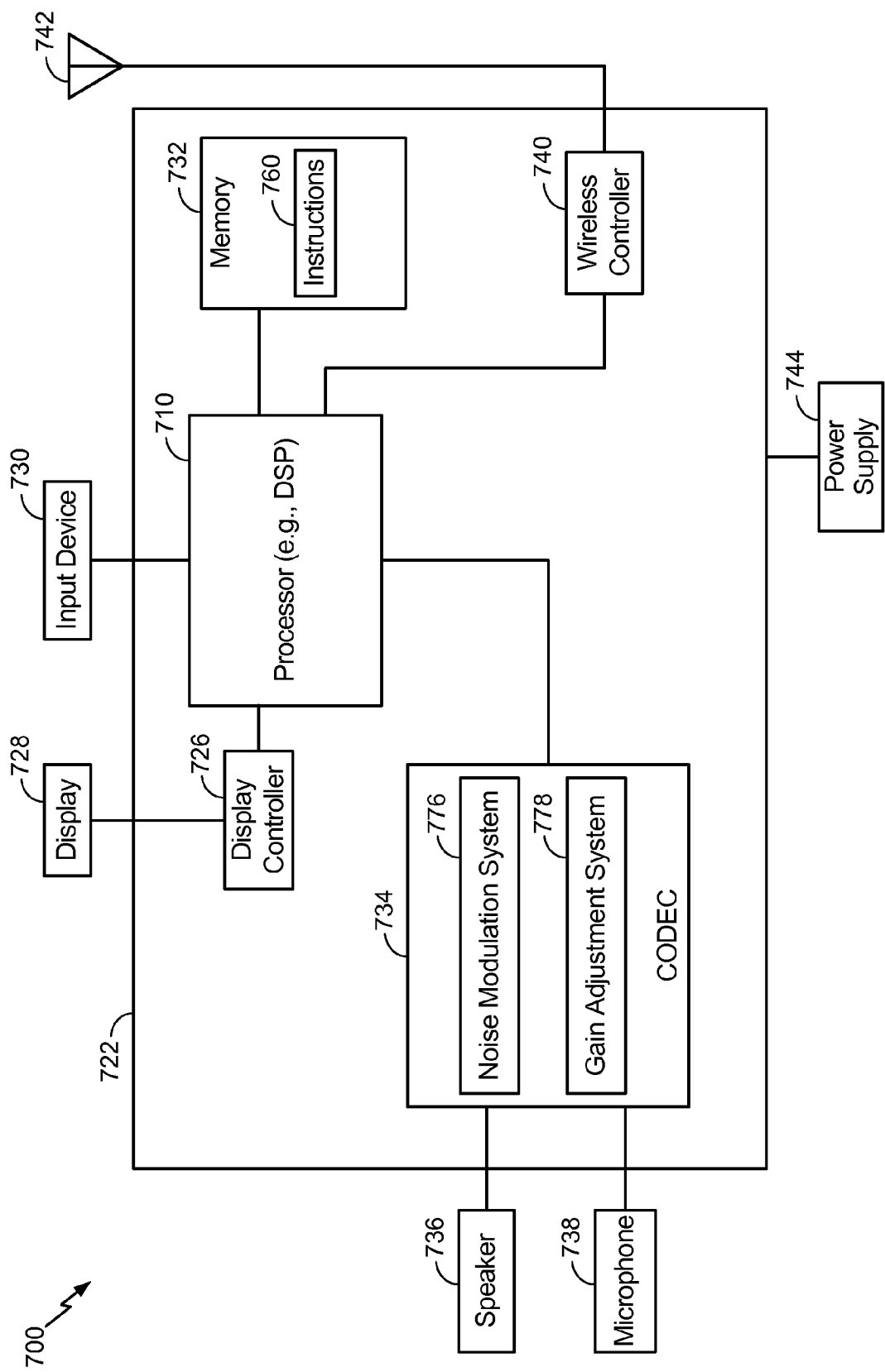
FIG. 7 is a block diagram of a wireless device operable to perform signal processing operations in accordance with the systems and methods of FIGS. 1-6.

Referring to FIG. 7, a block diagram of a particular illustrative embodiment of a wireless communication device is depicted and generally designated 700. The device 700 includes a processor 710 (e.g., a central processing unit (CPU), a digital signal processor (DSP), etc.) coupled to a memory 732. The memory 732 may include instructions 760 executable by the processor 710 and/or a coder/decoder (CODEC) 734 to perform methods and processes disclosed herein, such as the methods of FIGS. 5-6.

The CODEC 734 may include a noise modulation system 776. In a particular embodiment, the noise modulation system 776 includes one or more components of the system 400 of FIG. 4. The noise modulation system 776 may be implemented via dedicated hardware (e.g., circuitry), by a processor executing instructions to perform one or more tasks, or a combination thereof. As an example, the memory 732 or a memory in the CODEC 734 may be a memory device, such as a random access memory (RAM), magnetoresistive random access memory (MRAM), spin-torque transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, or a compact disc read-only memory (CD-ROM). The memory device may include instructions (e.g., the instructions 760) that, when executed by a computer (e.g., a processor in the CODEC 734 and/or the processor 710), may cause the computer to receive a first value of a mixing factor corresponding to a first portion of an audio signal, to receive a second value of the mixing factor corresponding to a second portion of the audio signal, and to generate a third value of the mixing factor at least partially based on the first value and the second value. As an example, the memory 732 or a memory in the CODEC 734 may be a non-transitory computer-readable medium that includes instructions (e.g., the instructions 760) that, when executed by a computer (e.g., a processor in the CODEC 734 and/or the processor 710), cause the computer perform at least a portion of the method 500 of FIG. 5.

The CODEC 734 may include a gain adjustment system 778. In a particular embodiment, the gain adjustment system 778 includes the gain adjuster 162 of FIG. 1. The gain adjustment system 778 may be implemented via dedicated hardware (e.g., circuitry), by a processor executing instructions to perform one or more tasks, or a combination thereof. As an example, the memory 732 may be a memory device that includes instructions (e.g., the instructions 760) that, when executed by a computer (e.g., a processor in the CODEC 734 and/or the processor 710), cause the computer to determine a first set of spectral frequency values corresponding to an audio signal, to determine a second set of spectral frequency values that approximates the first set of spectral frequency values, and to adjust a gain value corresponding to at least a portion of the audio signal based on a difference between the first set and the second set. As an example, the memory 732 or a memory in the CODEC 734 may be a non-transitory computer-readable medium that includes instructions (e.g., the instructions 760) that, when executed by a computer (e.g., a processor in the CODEC 734 and/or the processor 710), may cause the computer perform at least a portion of the method 600 of FIG. 6.

FIG. 7 also shows a display controller 726 that is coupled to the processor 710 and to a display 728. The CODEC 734 may be coupled to the processor 710, as shown. A speaker 736 and a microphone 738 can be coupled to the CODEC 734. For example, the microphone 738 may generate the input audio signal 102 of FIG. 1, and the CODEC 734 may generate the output bit stream 192 for transmission to a receiver based on the input audio signal 102. As another example, the speaker 736 may be used to output a signal reconstructed by the CODEC 734 from the output bit stream 192 of FIG. 1, where the output bit stream 192 is received from a transmitter. FIG. 7 also indicates that a wireless controller 740 can be coupled to the processor 710 and to a wireless antenna 742.

In a particular embodiment, the processor 710, the display controller 726, the memory 732, the CODEC 734, and the wireless controller 740 are included in a system-in-package or system-on-chip device (e.g., a mobile station modem (MSM)) 722. In a particular embodiment, an input device 730, such as a touchscreen and/or keypad, and a power supply 744 are coupled to the system-on-chip device 722. Moreover, in a particular embodiment, as illustrated in FIG. 7, the display 728, the input device 730, the speaker 736, the microphone 738, the wireless antenna 742, and the power supply 744 are external to the system-on-chip device 722. However, each of the display 728, the input device 730, the speaker 736, the microphone 738, the wireless antenna 742, and the power supply 744 can be coupled to a component of the system-on-chip device 722, such as an interface or a controller.

In conjunction with the described embodiments, an apparatus is disclosed that includes means for generating a third value of a mixing factor at least partially based on a first value of the mixing factor and a second value of the mixing factor, where the first value corresponds to a first portion of an audio signal received at an audio encoder and the second value corresponds to a second portion of the audio signal. For example, the means for generating may include the high-band excitation generator 160 of FIG. 1, the mixing factor adjuster 409 of FIG. 4, the noise modulation system 776 of FIG. 7 or a component thereof, one or more devices, such as a filter, configured to generate a third value based on the first value and the second value (e.g., a processor executing instructions at a non-transitory computer readable storage medium), or any combination thereof.

The apparatus may also include means for generating a high-band excitation signal corresponding to a high-band portion of the audio signal by combining modulated noise and a transformed version of a low-band excitation signal. The low-band excitation signal corresponds to a low-band portion of the audio signal. The means for generating may be configured to combine the modulated noise and the transformed version of the low-band excitation signal based on the third value. For example, the means for generating the high-band excitation signal may include the high-band excitation generator 160 of FIG. 1, the mixer 411 of FIG. 4, the noise modulation system 776 of FIG. 7 or a component thereof, one or more devices configured to generate an excitation signal (e.g., a processor executing instructions at a non-transitory computer readable storage medium), or any combination thereof.

In conjunction with the described embodiments, an apparatus is disclosed that includes means for determining a first set of spectral frequency values corresponding to an audio signal. For example, the means for determining the first set may include the LP analysis and coding module 152 of FIG. 1, the gain adjustment system 778 of FIG. 7 or a component thereof, one or more devices configured to generate spectral frequency values corresponding to an audio signal (e.g., a processor executing instructions at a non-transitory computer readable storage medium), or any combination thereof.

The apparatus may also include means for generating a second set of spectral frequency values that approximates the first set of spectral frequency values. For example, the means for generating the second set may include the quantizer 156 of FIG. 1, the gain adjustment system 778 of FIG. 7 or a component thereof, one or more devices configured to generate a second set of spectral frequency values that approximates a first set of spectral frequency values (e.g., a processor executing instructions at a non-transitory computer readable storage medium), or any combination thereof.

The apparatus may also include means for adjusting a gain value corresponding to at least a portion of the audio signal based on a difference between the first set and the second set. For example, the means for adjusting may include the gain adjuster 162 of FIG. 1, the gain adjustment system 778 of FIG. 7 or a component thereof, one or more devices configured to adjust a gain value (e.g., a processor executing instructions at a non-transitory computer readable storage medium), or any combination thereof.

Those of skill would further appreciate that the various illustrative logical blocks, configurations, modules, circuits, and algorithm steps described in connection with the embodiments disclosed herein may be implemented as electronic hardware, computer software executed by a processing device such as a hardware processor, or combinations of both. Various illustrative components, blocks, configurations, modules, circuits, and steps have been described above generally in terms of their functionality. Whether such functionality is implemented as hardware or executable software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in a memory device, such as random access memory (RAM), magnetoresistive random access memory (MRAM), spin-torque transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, or a compact disc read-only memory (CD-ROM). An exemplary memory device is coupled to the processor such that the processor can read information from, and write information to, the memory device. In the alternative, the memory device may be integral to the processor. The processor and the storage medium may reside in an application-specific integrated circuit (ASIC). The ASIC may reside in a computing device or a user terminal. In the alternative, the processor and the storage medium may reside as discrete components in a computing device or a user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method of synthesizing a high-band signal in an electronic device, the method comprising:
   receiving a first value of a mixing factor, the first value corresponding to a first portion of an audio signal received at an audio coder of the electronic device;
   receiving a second value of the mixing factor, the second value corresponding to a second portion of the audio signal;
   generating a third value of the mixing factor at least partially based on the first value, the second value, and an indication of a coding type corresponding to the audio signal; and
   generating a high-band excitation signal based on an excitation signal, modulated noise, and the third value of the mixing factor, wherein a gain value corresponding to at least a portion of the audio signal is used to generate a synthesized high-band signal based on the high-band excitation signal.

2. The method of claim 1, wherein the high-band excitation signal corresponds to a high-band portion of the audio signal, wherein the high-band excitation signal is generated based on combining, based on the third value of the mixing factor, the modulated noise and the excitation signal, wherein the excitation signal corresponds to a transformed version of a low-band excitation signal, the low-band excitation signal corresponding to a low-band portion of the audio signal, and wherein the electronic device comprises a mobile device.

3. The method of claim 2, wherein the high-band excitation signal comprises a weighted sum of the modulated noise and the transformed version of the low-band excitation signal.

4. The method of claim 1, wherein the first value is generated based on a low-band portion of a first sub-frame of the audio signal and wherein the second value is generated based on a low-band portion of a second sub-frame of the audio signal.

5. The method of claim 1, wherein generating the third value comprises determining a weighted sum of the first value and the second value.

6. The method of claim 5, wherein a first weight applied to the first value and a second weight applied to the second value are determined based on high-band energy fluctuation of the audio signal.

7. The method of claim 6, wherein the first weight and the second weight are determined based on a first high-band energy value corresponding to the first portion and further based on a second high-band energy value corresponding to the second portion.

8. The method of claim 7, wherein the first weight is selected to be greater than the second weight in response to the first high-band energy value exceeding a first threshold or in response to the second high-band energy value exceeding a second threshold, wherein the first threshold corresponds to the second high-band energy value scaled by a scaling factor, and wherein the second threshold corresponds to the first high-band energy value scaled by the scaling factor.

9. The method of claim 1, wherein generating the third value is further based on a spectral distortion corresponding to the audio signal.

10. The method of claim 1, wherein receiving the first value, receiving the second value, generating the third value, and generating the high-band excitation signal are performed by a media capture device.

11. The method of claim 1, wherein the first portion comprises a first sub-frame of the audio signal, wherein the second portion comprises a second sub-frame of the audio signal.

12. The method of claim 1, further comprising outputting high-band side information based on mixing the excitation signal with the modulated noise and adjusting the gain value.

13. The method of claim 12, wherein the gain value is adjusted based on a first set of spectral frequency values corresponding to the audio signal and a second set of spectral frequency values that approximates the first set of spectral frequency values.

14. The method of claim 1, wherein the audio coder comprises an encoder.

15. The method of claim 1, wherein the audio coder comprises a decoder.

16. The method of claim 1, further comprising receiving, via a microphone, the audio signal.

17. The method of claim 1, wherein the high-band excitation signal corresponds to a high-band portion of the audio signal, and wherein the high-band excitation signal is generated based on applying the third value of the mixing factor to the modulated noise and to the excitation signal to calculate a weighted sum of a first product of the third value and the modulated noise and a second product of the third value and the excitation signal.

18. The method of claim 17, wherein the gain value is determined based on a comparison of the synthesized high-band signal to a high-band signal of the audio signal.

19. The method of claim 1, further comprising determining the gain value based on the high-band excitation signal.

20. The method of claim 1, wherein the electronic device includes a communication device, and wherein receiving the first value, receiving the second value, generating the third value, and mixing the excitation signal with the modulated noise are performed by the communication device.

21. The method of claim 1, wherein the electronic device comprises a mobile communication device that receives a signal corresponding to the audio signal via at least one of a microphone or an antenna.

22. The method of claim 1, wherein receiving the first value, receiving the second value, generating the third value, and generating the high-band excitation signal are performed by a media playback device.

23. An apparatus for synthesizing a high-band signal in an electronic device, the apparatus comprising:
a filter configured to generate a third value of a mixing factor at least partially based on a first value of the mixing factor, a second value of the mixing factor, and an indication of a coding type corresponding to an audio signal received at the electronic device, wherein the first value corresponds to a first portion of the audio signal and wherein the second value corresponds to a second portion of the audio signal;
a mixer configured to receive the third value and to generate a high-band excitation signal corresponding to a high-band portion of the audio signal by generating modulated noise and combining the modulated noise and a transformed version of a low-band excitation signal, the low-band excitation signal corresponding to a low-band portion of the audio signal, wherein the mixer is configured to combine the modulated noise and the transformed version of the low-band excitation signal based on the third value; and
a gain circuit configured to determine a gain value corresponding to at least a portion of the audio signal, the gain value usable to generate a synthesized high-band signal based on the high-band excitation signal.

24. The apparatus of claim 23, wherein generating the third value is further based on a spectral distortion corresponding to the audio signal.

25. The apparatus of claim 23, further comprising:
an analysis filter configured to determine a first set of spectral frequency values corresponding to the audio signal; and
a quantizer configured to generate a second set of spectral frequency values that approximates the first set of spectral frequency values, wherein the gain circuit is further configured to adjust the gain value based on a difference between the first set and the second set, and wherein the gain value corresponds to at least one of the first portion or the second portion of the audio signal.

26. The apparatus of claim 23, wherein the filter is configured to determine a weighted sum of the first value and the second value.

27. The apparatus of claim 26, wherein a first weight applied to the first value and a second weight applied to the second value are determined based on high-band energy fluctuation of the audio signal.

28. The apparatus of claim 27, wherein the first weight and the second weight are determined based on a first high-band energy value corresponding to the first portion and further based on a second high-band energy value corresponding to the second portion.

29. The apparatus of claim 28, wherein the first weight is selected to be greater than the second weight in response to the first high-band energy value exceeding a first threshold or in response to the second high-band energy value exceeding a second threshold, wherein the first threshold corresponds to the second high-band energy value scaled by a scaling factor, and wherein the second threshold corresponds to the first high-band energy value scaled by the scaling factor.

30. The apparatus of claim 23, wherein the filter and the mixer are included in an encoder.

31. The apparatus of claim 23, wherein the filter and the mixer are included in a decoder.

32. The apparatus of claim 23, further comprising an input device configured to receive the audio signal.

33. The apparatus of claim 23, wherein the at least a portion of the audio signal includes a frame of the audio signal.

34. The apparatus of claim 23, further comprising:
an antenna; and
a receiver coupled to the antenna and configured to receive the audio signal.

35. The apparatus of claim 34, further comprising:
a processor coupled to the receiver; and
a coder coupled to the processor.

36. The apparatus of claim 35, wherein the electronic device includes a communication device, and wherein the receiver, the processor, and the coder are integrated into the communication device.

37. The apparatus of claim 35, wherein the receiver, the processor, and the coder are integrated into a communication device.

38. The apparatus of claim 35, wherein the receiver, the processor, and the coder are integrated into a media playback device.

39. The apparatus of claim 35, wherein the receiver, the processor, and the coder are integrated into a media capture device.

40. An apparatus for synthesizing a high-band signal in an electronic device, the apparatus comprising:
- means for generating a third value of a mixing factor at least partially based on a first value of the mixing factor, a second value of the mixing factor, and an indication of a coding type corresponding to an audio signal, wherein the first value corresponds to a first portion of the audio signal received at an audio coder of the electronic device and wherein the second value corresponds to a second portion of the audio signal;
- means for generating a high-band excitation signal corresponding to a high-band portion of the audio signal by combining modulated noise and a transformed version of a low-band excitation signal, the low-band excitation signal corresponding to a low-band portion of the audio signal, wherein the means for generating is configured to combine the modulated noise and the transformed version of the low-band excitation signal based on the third value; and
- means for determining a gain value corresponding to at least a portion of the audio signal, the gain value usable to generate a synthesized high-band signal based on the high-band excitation signal.

41. The apparatus of claim 40, wherein a first weight applied to the first value and a second weight applied to the second value are determined based on high-band energy fluctuation of the audio signal.

42. The apparatus of claim 40, wherein the third value is generated further based on a spectral distortion corresponding to the audio signal.

43. The apparatus of claim 40, wherein the electronic device includes a communication device, and wherein the means for generating the third value and the means for generating the high-band excitation signal are integrated into the communication device.

44. The apparatus of claim 40, wherein the electronic device comprises a mobile communication device including at least one of a microphone or an antenna configured to receive a signal corresponding to the audio signal.

45. The apparatus of claim 40, wherein the means for generating the third value and the means for generating the high-band excitation signal are integrated into a media playback device, a media capture device, or a combination thereof.

46. A non-transitory computer-readable medium comprising instructions that, when executed by a computer in an electronic device configured to synthesize a high-band signal, cause the computer to:
- receive a first value of a mixing factor, the first value corresponding to a first portion of an audio signal received at an audio coder of the electronic device;
- receive a second value of the mixing factor, the second value corresponding to a second portion of the audio signal;
- generate a third value of the mixing factor at least partially based on the first value, the second value, and an indication of a coding type corresponding to the audio signal; and
- generate a high-band excitation signal based on an excitation signal, modulated noise, and the third value of the mixing factor, wherein a gain value corresponding to at least a portion of the audio signal is usable to generate a synthesized high-band signal based on the high-band excitation signal.

47. The non-transitory computer-readable medium of claim 46, further comprising instructions that, when executed by the computer, cause the computer to generate the high-band excitation signal corresponding to a high-band portion of the audio signal, wherein the excitation signal corresponds to a transformed version of a low-band excitation signal, the low-band excitation signal corresponding to a low-band portion of the audio signal.

48. The non-transitory computer-readable medium of claim 47, wherein the high-band excitation signal comprises a weighted sum of the modulated noise and the transformed version of the low-band excitation signal.

49. The non-transitory computer-readable medium of claim 46, wherein the first value is generated based on a low-band portion of a first sub-frame of the audio signal and wherein the second value is generated based on a low-band portion of a second sub-frame of the audio signal.

\* \* \* \* \*